(12) United States Patent
Miyano (10) Patent No.: US 6,239,633 B1
(45) Date of Patent: May 29, 2001

(54) DIGITAL DLL CIRCUIT

(75) Inventor: Kazutaka Miyano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/413,726

(22) Filed: Oct. 7, 1999

(30) Foreign Application Priority Data

Oct. 13, 1998 (JP) .................................................. 10-290865

(51) Int. Cl.[7] ....................................................... H03L 7/06
(52) U.S. Cl. .......................................... 327/158; 327/159
(58) Field of Search .................................... 327/158, 141, 327/159, 261, 298, 276

(56) References Cited

U.S. PATENT DOCUMENTS 5,883,534 * 3/1999 Kondoh et al. ....................... 327/156

* cited by examiner

Primary Examiner—Toan Tran
Assistant Examiner—Cassandra Cox
(74) Attorney, Agent, or Firm—Sughrue, Mion, Zinn, Macpeak & Seas, PLLC (57) ABSTRACT

A digital Delay-Locked Loop (DLL) circuit includes a phase locking unit, an adder, and a phase delay unit. The phase locking unit generates a first internal clock phase-locked with an external clock by adjusting a first digital phase control amount on the basis of a phase difference between an external clock and the first internal clock. The adder adds a predetermined phase control amount to the first digital phase control amount to output a second digital phase control amount when the first internal clock is generated by the phase locking unit. The phase delay unit generates a second internal clock delayed from the external clock by the predetermined control amount, on the basis of the second digital phase control amount from the adder.

7 Claims, 7 Drawing Sheets

FIG. 10A PHASE DETERMINATION SIGNAL 16 | HIGH |

FIG. 10B CLOCK SELECTION OUTPUT 17 | 0 | 0 | 0 | 0 | 0 | 0 | 0 | 0 | 0 | 3 | 3 | 3 | 3 | 0 | 0 | 0 | 0 |

FIG. 10C PHASE SIGNAL OUTPUT 18 | 00 | 01 | 02 | 03 | 04 | 05 | 06 | 07 | 08 | 3B | 3C | 3D | 3E | 3F | 00 | 01 | 02 | 03 | 04 |

FIG. 10D PHASE DETERMINATION SIGNAL 16 | HIGH | LOW |

FIG. 10E CLOCK SELECTION OUTPUT 17 | 0 | 0 | 0 | 0 | 0 | 0 | 0 | 0 | 0 | 0 | 0 | 0 | 0 | 0 | 0 | 0 | 0 |

FIG. 10F PHASE SIGNAL OUTPUT 18 | 00 | 01 | 02 | 03 | 04 | 05 | 06 | 07 | 08 | 09 | 0A | 0B | 0C | 0B | 0A | 09 | 08 | 07 | 06 | 05 |

FIG. 11A PHASE DETERMINATION SIGNAL 16 | HIGH | L | H | L | H | L | H | L |

FIG. 11B CLOCK SELECTION OUTPUT 17 | 0 | 0 | 0 | 0 | 0 | 0 | 0 | 0 | 0 | 0 | 0 | 0 | 0 | 0 | 0 | 0 | 0 |

FIG. 11C PHASE SIGNAL OUTPUT 18 | 20 | 21 | 22 | 23 | 24 | 25 | 26 | 27 | 28 | 29 | 2A | 2B | 2C | 2B | 2C | 2B | 2C | 2B | 2C | 2B |

← LOCKED STATE

FIG. 12 PRIOR ART

DIGITAL DLL CIRCUIT

Background of the Invention

The present invention relates to a DLL (Delay-Locked Loop) circuit and, more particularly, to a digital DLL circuit for generating a clock having an arbitrary phase by controlling the phase of a predetermined external clock on the basis of a digital amount.

There is proposed a conventional digital DLL circuit for generating a clock having an arbitrary clock and the same frequency as that of an external clock by controlling the phase of the external clock on the basis of a digital amount. The arrangement of this conventional digital DLL circuit is shown in FIG. 8.

Figure 8:
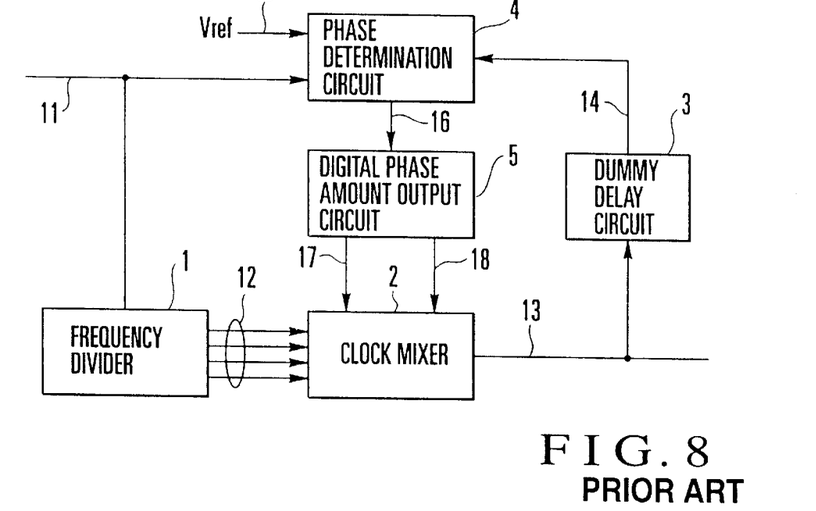
FIG. 8 is a block diagram of a conventional digital DLL circuit.
Figure 9A:
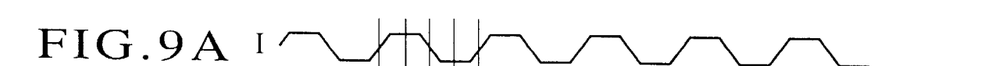
FIGS. 9A to 9D are timing charts showing the clock outputs from the frequency dividers shown in FIG. 1 (FIGS. 2) and 8.
Figure 9B:
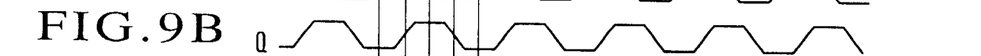
Figure 9C:
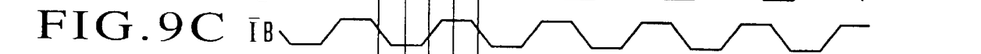
Figure 9D:
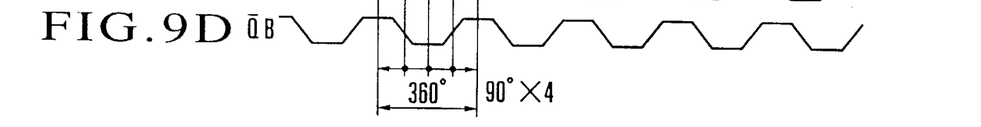

Referring to FIG. 8, a frequency divider 1 frequency-divides an external clock 11 into four clocks 12 made up of clocks I, Q, $\bar{I}B$, and $\bar{Q}B$ having a phase shift of 90°, and the four clocks 12 are output to a clock mixer 2. The clocks $\bar{I}B$ and $\bar{Q}B$ are inverted clocks (phase difference of 180°) of the clocks I and Q, respectively.

The clock mixer 2 mixes the clocks 12 on the basis of an output from a digital phase amount output circuit 5 to generate an internal clock 13 having a predetermined phase different from the external clock 11. In this case, a clock selection signal 17 (upper two bits) of an output from the digital phase amount output circuit 5 is used to select two clocks 12 to be mixed, and a phase signal 18 (remaining six bits) is used to designate the phase control amount (delay amount) of the internal clock 13 between the two selected clocks 12.

For example, while the clocks I and Q are selected by the clock selection signal 17, when the phase signal is given as "20H" (H represents that "20" is a hexadecimal number), the middle phase (45° delayed phase) between the clocks I and Q is selected.

The internal clock 13 generated as described above is input to a subsequent system and a dummy delay circuit 3. The dummy delay circuit 3 adds to the internal clock 13 a desired delay amount equivalent to the line length up to the subsequent system, and outputs the sum as a delayed clock 14 to a phase determination circuit 4. The phase determination circuit 4 compares the phase of the external clock 11 with the delayed clock 14 from the dummy delay circuit 3 using a reference voltage 15 (Vref) as a threshold value. The phase determination circuit 4 outputs a phase determination signal 16 to the digital phase amount output circuit 5.

Figure 10A:
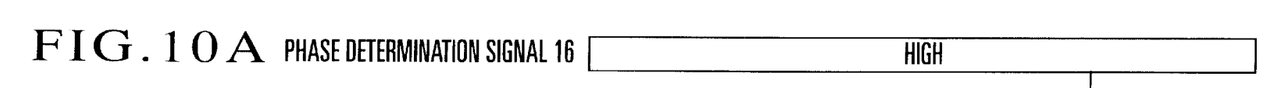
FIGS. 10A to 10F are timing charts showing the operation of the digital phase amount output circuits shown in FIG. 1 (FIGS. 5) and 8.
Figure 10B:
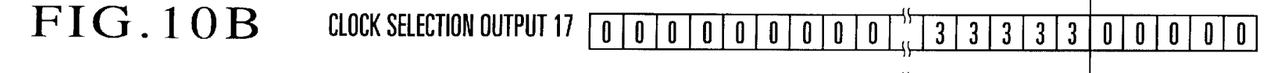
Figure 10C:
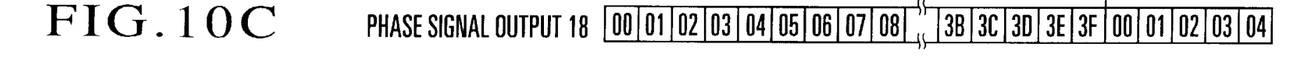

On the basis of the phase determination signal 16, the digital phase amount output circuit 5 generates the clock selection signal 17 and phase signal 18 made up of digital amounts output to the clock mixer 2. When the phase determination signal 16 is at H (High) level (FIG. 10A), the clock selection signal 17 and phase signal 18 output from the digital phase amount output circuit 5 are counted as a continuous 8-bit counter output, as shown in FIGS. 10B and 10C.

Figure 10D:
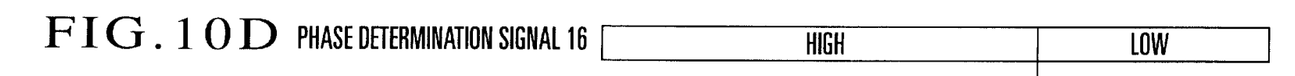
Figure 10E:
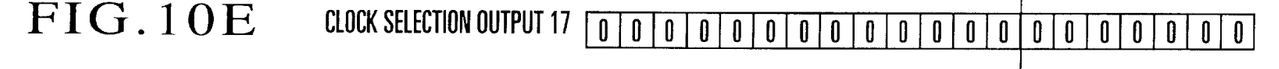
Figure 10F:
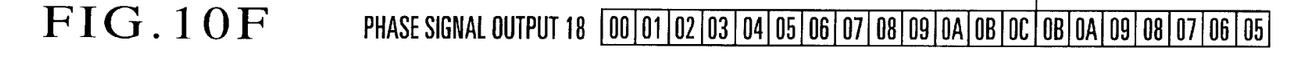

When the phase determination signal 16 changes to L (Low) level (FIG. 10D), the clock selection signal 17 and phase signal 18 are counted down as a continuous 8-bit counter output, as shown in FIGS. 10E and 10F.

Figure 11A:
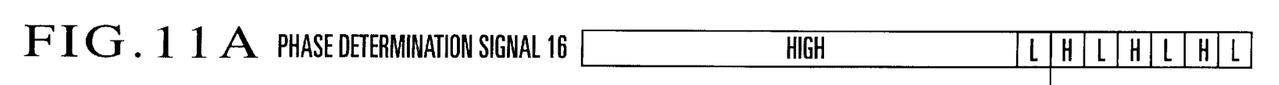
FIGS. 11A to 11C are timing charts showing the operation of the conventional DLL circuit.
Figure 11B:
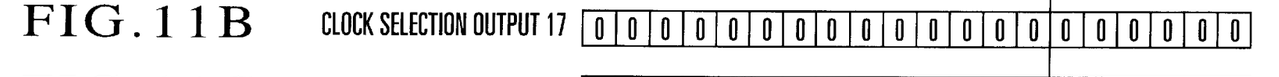
Figure 11C:
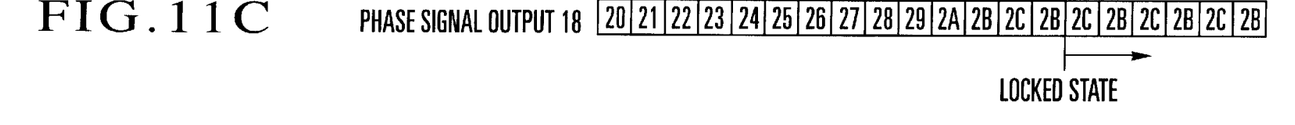

As shown in FIG. 11A, while the DLL is locked, the phase of the delayed clock 14 from the dummy delay circuit 3 is locked with that of the external clock 11, and the phase determination signal 16 repeats H and L levels. As shown in FIGS. 11B and 11C, the clock selection signal 17 and phase signal 18 become almost stable, and the internal clock 13 having a desired phase (delay amount) can be obtained.

Figure 12:
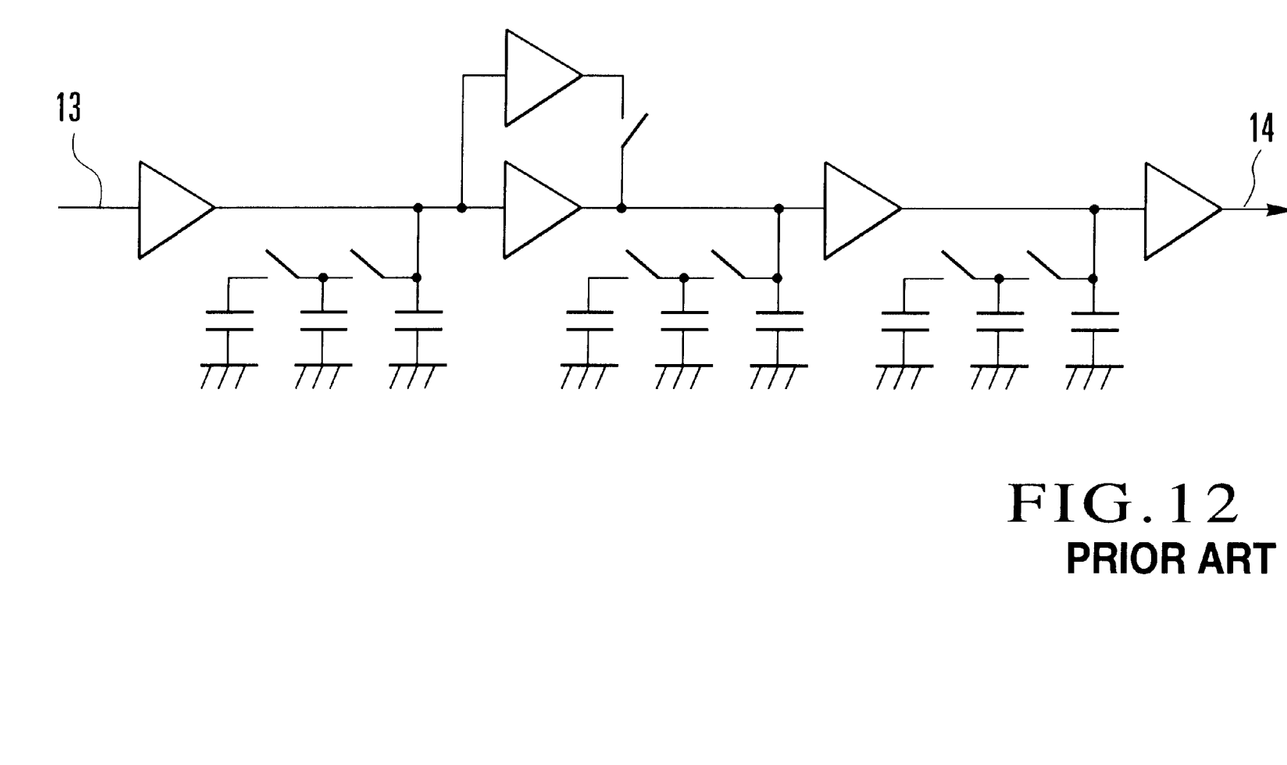
FIG. 12 is a block diagram of a dummy delay circuit shown in FIG. 8.

In the conventional digital DLL circuit, the loads of buffers and the size of the buffers in the dummy delay circuit 3 are adjusted to select an appropriate delay amount, as shown in FIG. 12, thereby controlling a phase position where the DLL is locked. An increase in delay amount has a limitation due to degradation of the waveform of the delayed clock 14, and an arbitrary phase cannot be set in a wide range. Therefore, the internal clock 13 having a large delay amount with respect to the external clock 11 cannot be obtained, resulting in inconvenience.

SUMMARY OF THE INVENTION

It is an object of the present invention to provide a digital DLL circuit capable of generating an internal clock having an arbitrary phase in a wide range with respect to an external clock.

In order to achieve the above object of the present invention, there is provided a digital Delay-Locked Loop (DLL) circuit comprising phase locking means for generating a first internal clock phase-locked with an external clock by adjusting a first digital phase control amount on the basis of a phase difference between an external clock and the first internal clock, addition means for adding a predetermined phase control amount to the first digital phase control amount to output a second digital phase control amount when the first internal clock is generated by the phase locking means, and phase delay means for generating a second internal clock delayed from the external clock by the predetermined control amount, on the basis of the second digital phase control amount from the addition means.

DESCRIPTION OF THE PREFERRED EMBODIMENT

The present invention will be described in detail with reference to the accompanying drawings.

Figure 1:
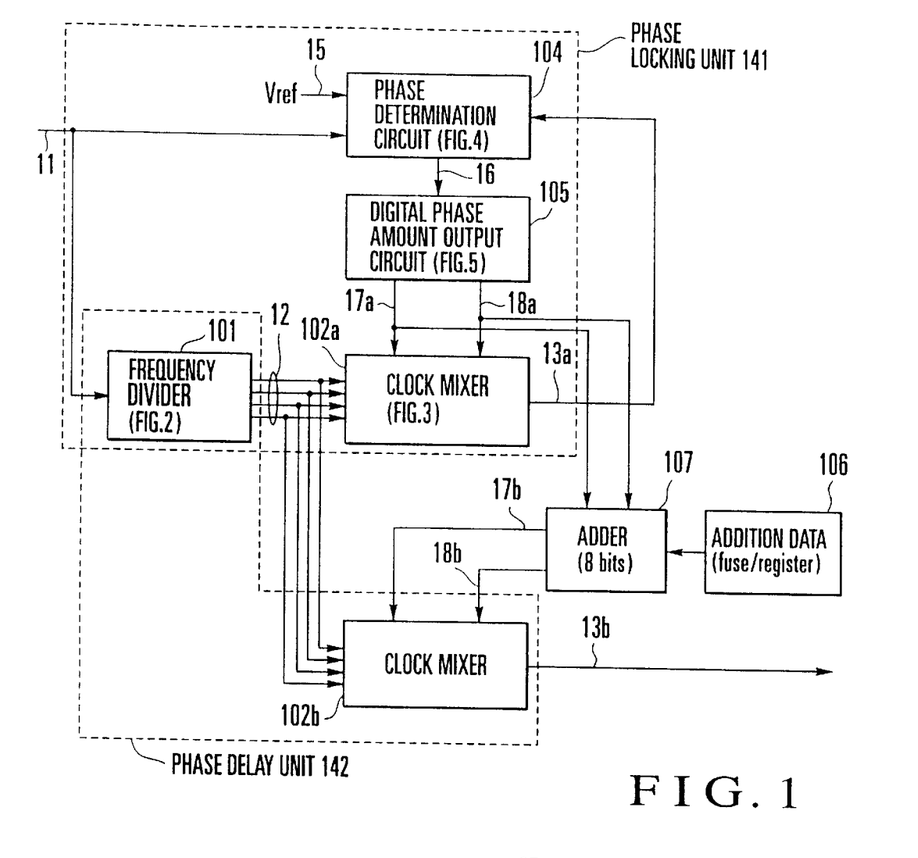
FIG. 1 is a block diagram of a digital DLL circuit according to an embodiment of the present invention.

FIG. 1 shows a digital DLL circuit according to an embodiment of the present invention.

In this embodiment, an absolute phase locking clock mixer 102a and a phase delay clock mixer 102b are arranged in place of the clock mixer 2 in the digital DLL circuit shown in FIG. 8. A digital phase control amount obtained by adding a desired amount to a phase control amount supplied to the clock mixer 102a is supplied to the clock mixer 102b.

Referring to FIG. 1, a frequency divider 101 frequency-divides an external clock 11 into four clocks 12 made up of clocks I, Q, $\overline{\text{IB}}$, and $\overline{\text{QB}}$ having a phase shift of 90°, and the four clocks 12 are output to the clock mixers 102a and 102b. The clocks $\overline{\text{IB}}$ and $\overline{\text{QB}}$ are inverted clocks (phase difference of 180°) of the clocks I and Q, respectively. Note that the frequency division number is arbitrarily determined. For example, the external clock may be divided into eight clocks having a phase difference of 45° or two clocks having a phase difference of 18°.

The clock mixer 102a selectively mixes the clocks 12 on the basis of an output from a digital phase amount output circuit 105 to generate an internal clock 13a having a predetermined phase difference from the external clock 11. In this case, a clock selection signal 17a (upper two bits) of an output from the digital phase amount output circuit 105 is used to select two clocks 12 to be mixed, and a phase signal 18a (remaining six bits) is used to designate the phase control amount (delay amount) of the internal clock 13a between the two selected clocks 12.

A phase determination circuit 104 compares the phase of the external clock 11 with that of an internal clock 13a from the clock mixer 102a using a reference voltage 15 (Vref) as a threshold value. The phase determination circuit 104 then outputs a phase determination signal 16 to the digital phase amount output circuit 105.

On the basis of a phase determination signal 16 from the phase determination circuit 104, the digital phase amount output circuit 105 generates the clock selection signal 17a and phase signal 18a made up of digital amounts output to the clock mixer 102a.

An adder 107 adds addition data 106 representing a predetermined phase difference (delay amount) to the clock selection signal 17a and phase signal 18a from the digital phase amount output circuit 105. The adder 107 then outputs the upper two bits as a clock selection signal 17b and the remaining six bits as a phase signal 18b to the clock mixer 102b. The addition data 106 is stored in a register in advance.

On the basis of an output from the adder 107, the clock mixer 102b selectively mixes the clocks 12 on the basis of an output from the adder 107 to generate an internal clock 13b having a predetermined phase difference from the external clock 11. In this case, the clock selection signal 17b (upper two bits) of the output from the adder 107 is used to select two clocks 12, and the phase signal 18b (remaining six bits) is used to designate the phase control amount (delay amount) of the internal clock 13b between the two selected clocks 12.

The frequency divider 101, clock mixer 102a, phase determination circuit 104, and digital phase amount output circuit 105 constitute a phase locking unit 141. The phase locking unit 141 adjusts the clock selection signal 17a and phase signal 18a constituting the first digital phase control amount to generate the first internal clock 13a phase-locked with the external clock 11.

The frequency divider 101 and clock mixer 102b constitute a phase delay unit 142. The phase delay unit 142 generates the second internal clock 13b delayed by a desired phase control amount (addition data 106) from the external clock 11 on the basis of the clock selection signal 17b and phase signal 18b constituting the second digital phase control amount.

Figure 2:
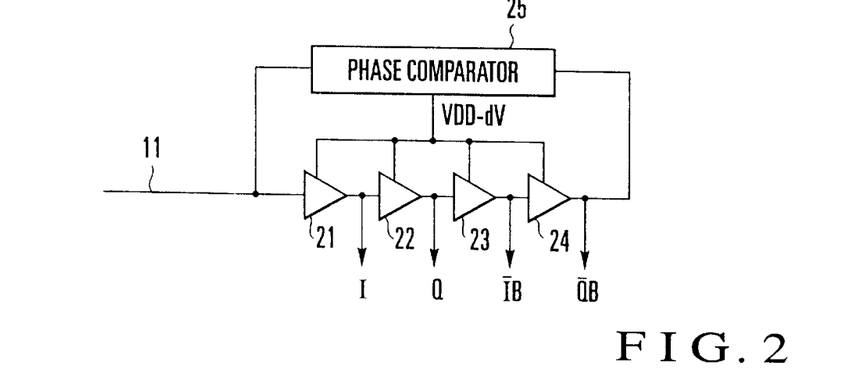
FIG. 2 is a circuit diagram of a frequency divider shown in FIG. 1.

FIG. 2 shows the frequency divider 101.

Referring to FIG. 2, four buffers 21 to 24 for outputting the clocks I, $\overline{\text{IB}}$, Q, and $\overline{\text{QB}}$ (FIGS. 9A, 9C, 9B, and 9D), respectively, are cascade-connected. A phase comparator 25 adjusts the delay amounts of the buffers 21 to 24 so as to lock the phase of the external clock 11 with that of the clock $\overline{\text{QB}}$.

On the basis of the output from the digital phase amount output circuit 105, the clock mixer 102a mixes the two clocks 12 output from the frequency divider 101 and selected from the clocks 12. The clock mixer 102a outputs the internal clock 13a having a predetermined phase difference (delay amount) from the external clock 11.

In this case, the clock selection signal 17a (upper two bits: signal bits b6 and b7) of the output from the digital phase amount output circuit 105 is used to select the clocks 12 to be mixed, and the phase signal 18a (remaining six bits: signal bits b0 to b5) is used to designate the phase control amount (delay amount) of the internal clock 13a between the two selected clocks 12.

Figure 3:
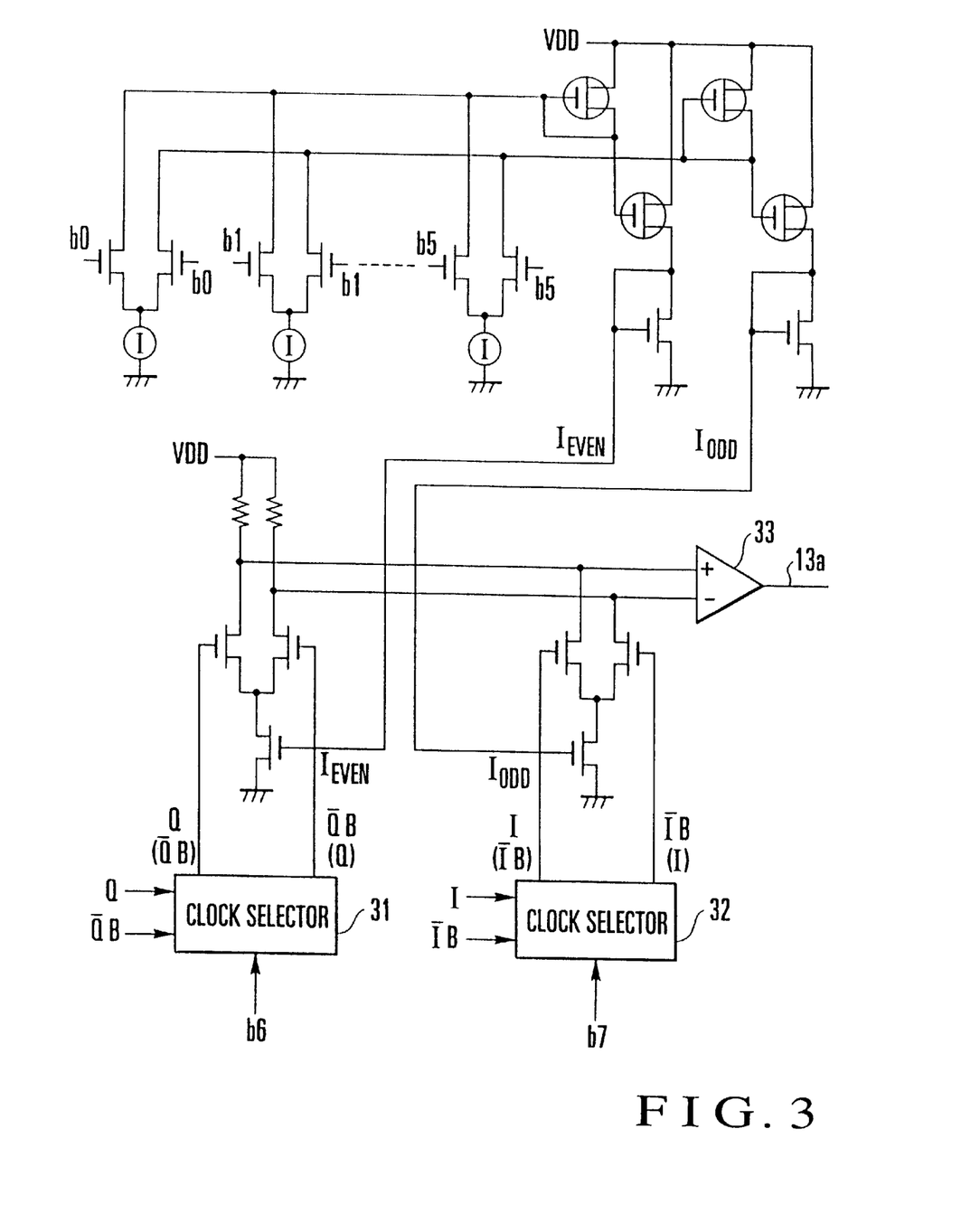
FIG. 3 is a circuit diagram of a clock mixer shown in FIG. 1.

FIG. 3 shows the clock mixer 102a. The clock mixer 102b has the same arrangement as that of the clock mixer 102a. Note that signal bits $\overline{\text{b0}}$ to $\overline{\text{b7}}$ are inverted signal bits of the signal bits b0 to b7.

Referring to FIG. 3, currents IEVEN and IODD that change in accordance with the bit values of H and L levels of the signal bits b0 to b5 constituting the phase signal 18a are generated. A pair of clocks Q and $\overline{\text{QB}}$ and a pair of clocks I and $\overline{\text{IB}}$ are selectively switched in accordance with the signal bits b6 and b7 constituting the clock selection signal 17a. The selected pair of clocks are supplied to the noninverting (+) and inverting (−) input terminals of a buffer 33, respectively. In this case, a gain ratio of the clocks Q and $\overline{\text{QB}}$ and the clocks I and $\overline{\text{IB}}$ is determined by the currents IEVEN and IODD.

Assume that the clocks I and Q are selected by the clock selection signal 17a of "0H" (H represents the hexadecimal notation). In this case, when the phase signal 18a is at "20H", the noninverting input terminal of the buffer 33 receives the clock I having an amplitude corresponding to the current IODD and the clock Q delayed by 90° from the clock I and having an amplitude corresponding to the current IEVEN.

The inverting input terminal of the buffer 33 receives the clock $\overline{\text{IB}}$ having an amplitude corresponding to the current IODD and the clock $\overline{\text{QB}}$ delayed from the clock $\overline{\text{IB}}$ by 90° and having an amplitude corresponding to the current IEVEN. The buffer 33 generates an almost triangular wave on the basis of these input signals, and the internal clock 13a having a middle phase between the clocks I and Q is generated on the basis of the peak position of the triangular wave. The internal clock 13a generated by the clock mixer 102a is output to the phase determination circuit 104.

In this case, the phase signal 18a has a 6-bit width of "00H" to "3FH", and "20H" represents the middle position in this width. In practice, the phase can be controlled for each 1/64 of the phase difference between the two clocks. When the clocks Q and $\overline{\text{IB}}$, clocks $\overline{\text{IB}}$ and $\overline{\text{QB}}$, or the clocks $\overline{\text{QB}}$ and I are selected by the clock selection signal 17a, the phase of the internal clock 13a can be controlled at a resolution of 1/256 with respect to one period of the external clock 11.

Figure 4:
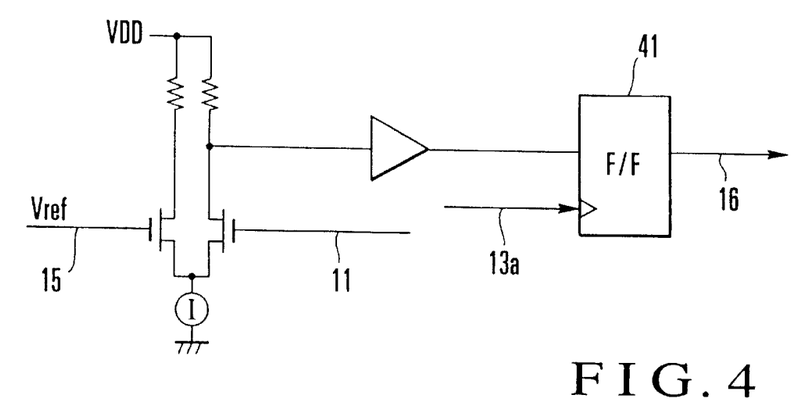
FIG. 4 is a circuit diagram of a phase determination circuit shown in FIG. 1.

FIG. 4 shows the phase determination circuit 104.

Referring to FIG. 4, the difference output between the external clock 11 and the reference voltage Vref serving as the threshold value is latched by a flip-flop (F/F) 41 at the timing of the internal clock 13a. The phase difference between the external clock 11 and the internal clock 13a, i.e., the phase determination signal 16 having the logic corresponding to the phase advance/delay, is output to the digital phase amount output circuit 105. The digital phase amount output circuit 105 generates the clock selection signal 17a and phase signal 18a on the basis of this phase determination signal 16.

Figure 5:
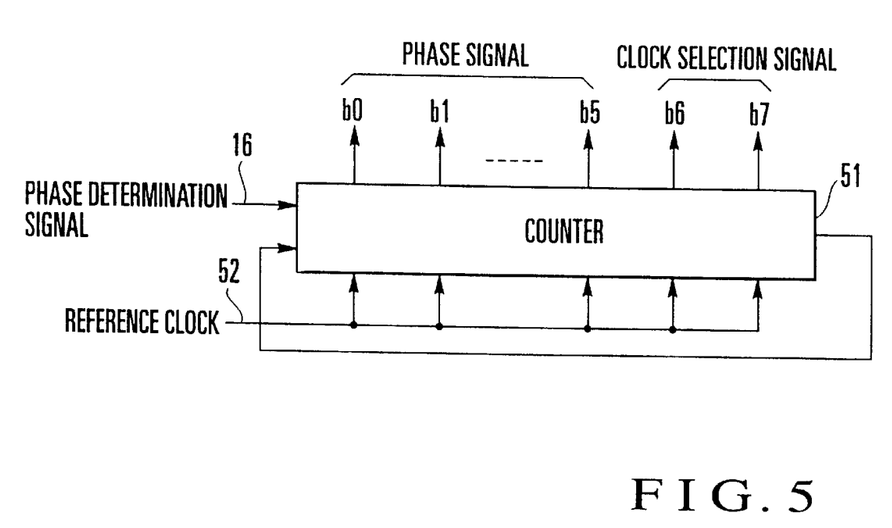
FIG. 5 is a view for explaining the arrangement of a digital phase amount output circuit shown in FIG. 1.

FIG. 5 shows the digital phase amount output circuit 105.

Referring to FIG. 5, the digital phase amount output circuit 105 is comprised of a counter 51 for incrementing/decrementing an 8-bit counter output by one every reference clock 52. The upper two bits b6 and b7 of the output from the counter 51 form the clock selection signal 17a, and the remaining bits b0 to b5 form the phase signal 18a. The counter 51 performs the addition/subtraction in accordance with the logic level of the phase determination signal 16. In the same manner as described above, when the phase determination signal 16 is at H level, the counter output is counted up. When the signal 16 is at L level, the counter output is counted down (FIGS. 10A to 10C).

Figure 6A:
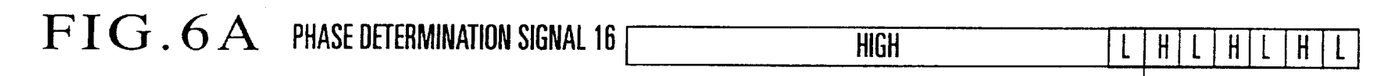
FIGS. 6A to 6F are timing charts showing the operation of the digital DLL circuit shown in FIG. 1.
Figure 6B:
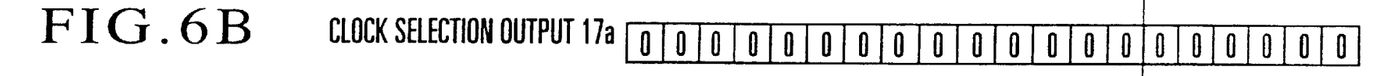

In the locked state of the DLL, the phase of the internal clock 13a from the clock mixer 102a is locked with that of the external clock 11. As shown in FIG. 6B, the phase determination signal 16 repeats H and L levels. Therefore, the internal clock 13a absolute phase-locked with the external clock 11 without any phase delay is output from the clock mixer 102a.

Figure 6C:
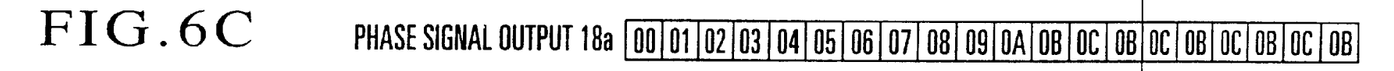
Figure 6D:
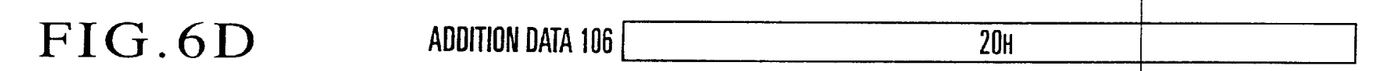
Figure 6E:
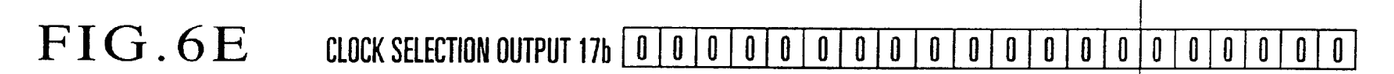
Figure 6F:
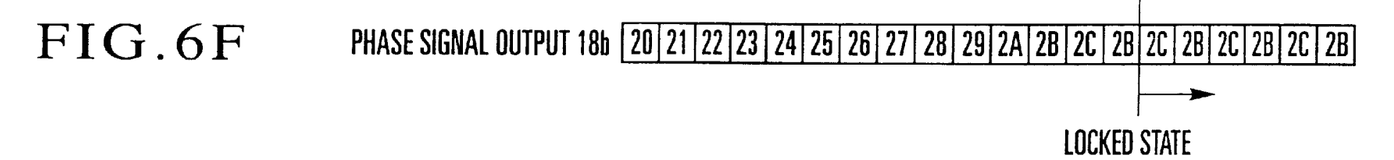

The clock selection signal 17a and phase signal 18a (FIGS. 6B and 6C) input to the clock mixer 102a are also input to the adder 107. The adder 107 adds digital addition data 6 (FIG. 6D) representing a desired phase difference (delay amount) to the 8-bit data of the clock selection signal 17a and phase signal 18a. As shown in FIGS. 6E and 6F, the upper two bits and the remaining six bits are output as the clock selection signal 17b and phase signal 18b, respectively.

The clock mixer 102b outputs the internal clock 13b having a phase difference representing the addition data with respect to the absolute phase of the external clock 11 is output on the basis of the clock selection signal 17b and phase signal 18b from the adder 107.

As described above, the two clock mixers, i.e., the absolute phase locking clock mixer 102a and the phase delay clock mixer 102b are arranged. The desired digital phase control amount is added to the phase control amount of the clock mixer 102a with respect to the clock mixer 102b. As compared with the conventional case using the dummy delay circuit, the increase in delay amount is not limited even upon occurrence of degradation of the delayed clock. An internal clock having an arbitrary phase can be generated in a wide range. Due to the absence of the dummy delay circuit, a change in duty ratio or transient time does not occur in the clock compared with the external clock 11 in the phase determination circuit 104.

Unlike in the case using the dummy delay circuit, the circuit need not be stabilized even in a short H-level period. An internal clock need not have frequency characteristics more precise than those of the external clock.

In the above description, the clock mixer 102a generates the internal clock 13a absolute phase-locked with the external clock 11. However, the present invention is not limited to this. An internal clock delayed by a predetermined amount may be generated. In this case, the addition data 106 must contain the predetermined delay amount.

An application of the present invention will be described below.

For example, a RAM-bus DRAM (Dynamic Random Access Memory) is a DRAM operating in synchronism with a clock as in a synchronous DRAM. To operate the RAM-bus DRAM by a clock having a higher speed than that of the synchronous DRAM, the digital DLL circuit of the present invention is mounted in the RAM-bus DRAM.

Figure 7:
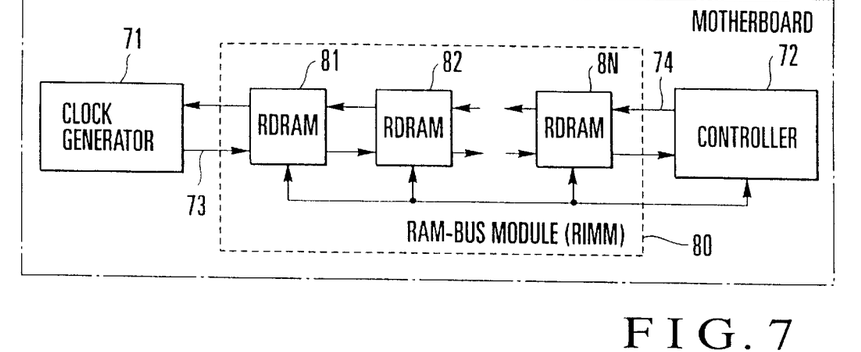
FIG. 7 is a block diagram showing the schematic arrangement of an application to a RAM-bus DRAM.

FIG. 7 shows the schematic arrangement of the RAM-bus DRAM.

Referring to FIG. 7, RAM-bus DRAMs (RDRAMs) 81 to 8N are mounted in units of 8 or 16 RDRAMs on a RAM-bus module 80 called an RIMM. Each of the RDRAMs 81 to 8N exchanges data with a controller 72 on a motherboard 70 in response to a clock supplied from a clock generator 71 on the motherboard 70. The clocks are slightly delayed in the RDRAMs 81 to 8N and controller 72 depending on the lengths of interconnections. When data is exchanged in synchronism with a high-speed clock, the delay causes a data transfer error. As shown in FIG. 7, data is output from each of the RDRAMs 81 to 8N to the controller 72 in synchronism with a clock supplied from the clock generator 71 to the controller 72, i.e., an output clock 73, thereby preventing a data transfer error caused by the delay.

Data is received from the controller 72 to each of the RDRAMs 81 to 8N in synchronism with a clock returned from the controller 72 to the clock generator 71, i.e., an input clock 74, thereby preventing a data transfer error caused by the delay.

Each of the RDRAMs 81 to 8N requires an internal clock synchronized with the external output clock 73 or external input clock 74. The data is exchanged between the controller 72 and each RDRAM at high speed (e.g., every 1.2 ns). When the external clocks are simply buffered and used, the data transfer error occurs due to the buffer delay time (normally, about 1 ns).

To solve this problem, the digital DLL circuit of the present invention is arranged in each of the RDRAMs 81 to 8N, and an internal clock (internal clock 13 in FIG. 1 or 8) phase-locked with the external clock (external clock 11 in FIG. 1 or 8) is generated and used.

As internal clocks, output and input clocks are separately required. Since the delay amounts of the output and input clocks are fixed, the input clock can be generated by delaying the output clock by a predetermined amount.

The RDRAMs 81 to 8N have different delay amounts from the output clocks 73 to the input clocks 74. In generating the input internal clocks by delaying the output clock 73, the delay amounts must be separately set for the digital DLL circuits in the RDRAMs 81 to 8N.

Conventionally, these delay amounts are adjusted by the dummy delay circuits 3 (see FIG. 8) of the respective digital DLL circuits at the time of manufacture.

According to the present invention, as shown in FIG. 1, the delay amounts can be adjusted by changing the digital addition data 106. For this purpose, when initializing the RDRAMs 81 to 8N mounted on the motherboard 70, addition data 106 are set from the controller 72 to the respective RDRAMs 81 to 8N. Therefore, the optimal delay amounts can be individually and easily set in the RDRAMs 81 to 8N as a system.

In initialization, the addition data 106 may be changed little by little, and the phases of the resultant internal clocks may be checked to optimize the phases. Therefore, the internal clocks having phases corresponding to the mounting environment of the RDRAMs 81 to 8N can be easily generated.

As has been described above, according to the present invention, as compared with the conventional case using the dummy delay circuit, the increase in delay amount is not limited even upon occurrence of degradation of the waveform of the delay clock. An internal clock having an arbitrary phase can be generated in a wide range.

What is claimed is:

1. A digital Delay-Locked Loop (DLL) circuit comprising:

phase locking means for generating a first internal clock phase-locked with an external clock by adjusting a first digital phase control amount on the basis of a phase difference between an external clock and the first internal clock;

addition means for adding a predetermined phase control amount to the first digital phase control amount to output a second digital phase control amount when the first internal clock is generated by said phase locking means; and phase delay means for generating a second internal clock delayed from the external clock by the predetermined phase control amount, on the basis of the second digital phase control amount from said addition means.

2. A circuit according to claim 1, wherein said phase locking means generates a first internal clock absolute phase-locked with the external clock without any delay.

3. A circuit according to claim 1, wherein said phase locking means comprises:

phase determination means for comparing a phase of the external clock with that of the first internal clock to output a phase determination signal;

phase amount output means for outputting the first digital phase control amount to said addition means on the basis of the phase determination signal from said phase determination means; and first clock mixing means for receiving a plurality of frequency-divided clocks having a phase difference of a predetermined phase, generating from the plurality of frequency-divided clocks, on the basis of the first digital phase control amount from said phase amount output means, a first internal clock phase-locked with the external clock, and outputting the first internal clock to said phase determination means.

4. A circuit according to claim 3, wherein said phase delay means comprises second clock mixing means for receiving the plurality of frequency-divided clocks, and generating from the plurality of frequency-divided clocks, on the basis of the second digital phase control amount from said addition means, a second internal clock phase-locked with the external clock.

5. A circuit according to claim 4, wherein the first and second digital phase delay amounts are made up of a clock selection signal and phase signal comprised of a plurality of signal bits, and said first and second clock mixing means selects two of the plurality of frequency-divided clocks in accordance with the clock selection signal and respectively generate first and second internal clocks having phases between the two selected frequency-divided clocks in accordance with the phase signal.

6. A circuit according to claim 5, wherein the first and second digital phase control amounts are made up of the clock selection signal of upper two bits and the phase signal of remaining six bits.

7. A circuit according to claim 4, further comprising frequency-dividing means for outputting to said first and second clock mixing means the plurality of frequency-divided clocks having a phase difference of a predetermined phase, the frequency-divided clocks being obtained by frequency-dividing the external clock.

* * * * *